United States Patent
Larson (10) Patent No.: US 9,853,623 B2
(45) Date of Patent: Dec. 26, 2017

(54) HIGH-SELECTIVITY LOW-LOSS DUPLEXER

(71) Applicant: Brown University, Providence, RI (US)

(72) Inventor: Lawrence Larson, Providence, RI (US)

(73) Assignee: Brown University, Providence, RI (US)

( * ) Notice: Subject to any disclaimer, the term of this patent is extended or adjusted under 35 U.S.C. 154(b) by 124 days.

(21) Appl. No.: 14/966,721

(22) Filed: Dec. 11, 2015

(65) Prior Publication Data

US 2016/0182006 A1 Jun. 23, 2016

Related U.S. Application Data (60) Provisional application No. 62/095,702, filed on Dec. 22, 2014.

(51) Int. Cl.
*H03H 7/46* (2006.01)
*H03H 7/21* (2006.01)

(52) U.S. Cl.
CPC ........... *H03H 7/463* (2013.01); *H03H 7/21* (2013.01)

(58) Field of Classification Search
CPC ......... H03H 2/00; H03H 11/04; H03H 7/463; H03H 7/46; H03H 7/466; H03H 7/468; H03H 7/18; H03H 7/21; H04B 1/48; H04B 1/44; H04B 1/52; H01F 38/14
USPC ....................................................... 333/132
See application file for complete search history.

(56) References Cited

U.S. PATENT DOCUMENTS

| | | | | |
|---|---|---|---|---|
| 4,978,931 A | * | 12/1990 | Carp | H03H 7/20 333/139 |
| 7,474,150 B2 | * | 1/2009 | Schemmann | H03F 1/32 330/149 |
| 9,154,289 B2 | * | 10/2015 | Mikhemar | H04L 5/14 |
| 2001/0019264 A1 | | 9/2001 | Shattil | |
| 2005/0104776 A1 | | 5/2005 | Anderson | |
| 2009/0168856 A1 | | 7/2009 | Muhammad | |
| 2012/0146742 A1 | | 6/2012 | Caron et al. | |
| 2013/0176914 A1 | | 7/2013 | Khlat | |
| 2013/0241669 A1 | | 9/2013 | Mikhemar et al. | |
| 2014/0162712 A1 | | 6/2014 | Feld et al. | |
| 2014/0306780 A1 | * | 10/2014 | Lehtinen | H03H 7/463 333/131 |

(Continued)

OTHER PUBLICATIONS

PCT International Search Report and Written Opinion for PCT/US15/65313, dated Apr. 19, 2016; 10 pages.

(Continued)

*Primary Examiner* — Robert J Pascal
*Assistant Examiner* — Kimberly Glenn
(74) *Attorney, Agent, or Firm* — Atesa Legal PLLC (57) ABSTRACT

A high-selectivity low-loss duplexing system includes a first duplexer having a first port, a second port, a transmit port and a receive port. A second duplexer has a third port, a fourth port, an inverted transmit port and the receive port. The first port and the third port are connected to an antenna by a balun. The transmit port and the inverted transmit port are connected to at least one power amplifier. The receive port is connected to a low noise amplifier. A phase shifter includes a lattice filter configured to short the second port to the third port and the fourth port to the first port at a receive frequency, and short the second port to the first port and the fourth port to the third port at a transmit frequency.

19 Claims, 8 Drawing Sheets

(56) References Cited

U.S. PATENT DOCUMENTS

2016/0380604 A1* 12/2016 Chance ................. H03H 2/005
　　　　　　　　　　　　　　　　　　　　　　　　333/119

OTHER PUBLICATIONS

Sherif H. Abdelhalem et al, "Hybrid Transformer-Based Tunable Differential Duplexer in a 90-nm CMOS Process," IEEE Transactions on Microwave Theory and Techniques, vol. 61, No. 3, Mar. 2013; 11 pages.

Sherif H. Abdelhalem et al, "Tunable CMOS Integrated Duplexer With Antenna Impedance Tracking and High Isolation in the Transmit and Receive bands," IEEE Transactions on Microwave Theory and Techniques, vol. 62, No. 3, Sep. 2014; 13 pages.

* cited by examiner

FIG. 1

PRIOR ART

FIG. 2

PRIOR ART

HIGH-SELECTIVITY LOW-LOSS DUPLEXER

CROSS-REFERENCE TO RELATED APPLICATIONS

This application is a utility application claiming priority to U.S. Provisional Application Ser. No. 62/095,702 filed on Dec. 22, 2014 entitled "HIGH-SELECTIVITY PASSIVE LOW-LOSS DUPLEXER/FILTER," the entirety of which is incorporated by reference herein.

FIELD

This disclosure relates generally to electronic duplexers, and more specifically to efficient systems and methods for duplexing electronic signals with a low-loss phase shifting network.

BACKGROUND

Electronic communication systems frequently require contemporaneous transmission and reception of electromagnetic signals through a shared resource. For example, a mobile phone will both transmit and receive respective signals on the same antenna. An antenna is commonly shared with a transmitter and a receiver with a duplexer, which minimizes interference between the transmitter and receiver paths, by using bulky filters and antenna impedance matching circuitry (e.g. balancing networks).

In particular, Surface Acoustic Wave (SAW) and Bulk Acoustic Wave (BAW) filters are used in many cellular telephone duplexers adding to cost and space. Furthermore, the balancing network can consume up to 50% of the transmitter power as well as degrade the isolation between transmitter and receiver paths due to manufacturing and environmental variations in the components used to match the antenna impedance.

BRIEF SUMMARY

As will be appreciated, embodiments as disclosed herein include at least the following. In one embodiment, a method for electronic duplexing comprises coupling by positive mutual induction, an input signal at a first port to a receive port. A phase-shifted signal is coupled by negative mutual induction at a second port to the receive port. An output signal is coupled by induction at a transmit port to the first port. The output signal is coupled by induction at the transmit port to the second port. The phase-shifted signal is formed by phase shifting the input signal by 180 degrees at a receive frequency and by zero degrees at a transmit frequency.

Alternative embodiments of the method for electronic duplexing include one of the following features, or any combination thereof. Coupling by positive mutual induction, an inverted input signal at a third port to the receive port, coupling by negative mutual induction, an inverted phase-shifted signal at a fourth port to the receive port, coupling by induction, an inverted output signal at an inverted transmit port to the third port, coupling by induction, the inverted output signal at the inverted transmit port to the fourth port, wherein phase shifting the input signal by 180 degrees at the receive frequency comprises shorting the phase-shifted signal to the inverted input signal and the inverted phase-shifted signal to the input signal, and wherein phase shifting the input signal by zero degrees at the transmit frequency comprises shorting the phase-shifted signal to the input signal and the inverted phase-shifted signal to inverted input signal. A transmit-receive coupling from the transmit port to the receive port is nullified by the coupling of the output signal from the transmit port to the first port and the coupling of the output signal from the transmit port to the second port. A differential low noise amplifier amplifies a difference between the input signal and the phase-shifted signal, coupled to the receive port. A power amplifier generates the output signal at the transmit port. A balun coupled to an antenna receives the input signal and the inverted input signal. The input signal and the output signal are contemporaneous. One of the receive frequency and the transmit frequency are reconfigured. A phase shift of one of the input signal and the inverted input signal are calibrated to reduce one of a manufacturing process variation and an environmental variation.

In another embodiment, an electronic duplexer comprises a first port coupled to a transmit port by a primary winding of a first transformer. A second port is coupled to the transmit port by a primary winding of a second transformer. A receive port bridges a secondary winding of the first transformer connected to a secondary winding of a the second transformer. A phase shifter is configured to phase shift an input signal at the first port to generate a phase-shifted signal at the second port, the phase shifter shifting the input signal by 180 degrees at a receive frequency and by zero degrees at a transmit frequency.

Alternative embodiments of the electronic duplexer include one of the following features, or any combination thereof. A third port is coupled to an inverted transmit port by a primary winding of a third transformer, a fourth port is coupled to the inverted transmit port by a primary winding of a fourth transformer, the receive port bridges a secondary winding of the third transformer connected to a secondary winding of the fourth transformer, and the phase shifter is further configured to phase shift an inverted input signal at the third port to generate an inverted phase-shifted signal at the fourth port, the phase shifter shifting the inverted input signal by 180 degrees at a receive frequency and by zero degrees at a transmit frequency. The phase shifter comprises a bridged-T delay equalizer between the first port and the second port. The phase shifter comprises a lattice filter configured to phase shift the input signal by 180 degrees at the receive frequency by shorting the phase-shifted signal to the inverted input signal and the inverted phase-shifted signal to the input signal, and phase shift the input signal by zero degrees at the transmit frequency by shorting the phase-shifted signal to the input signal and the inverted phase-shifted signal to the inverted input signal. The phase shifter comprises a first bridged-T delay equalizer between the first port and the second port, and a second bridged-T delay equalizer between the third port and the fourth port. The first port and the third port are connected to an antenna by a balun. A mode configuration module is configured to modify the phase shifter for at least one of a different receive frequency and a different transmit frequency. A calibration module is configured to calibrate the phase shifter to reduce one of a manufacturing process variation and an environmental variation for at least one of the receive frequency and the transmit frequency.

In another embodiment, a high-selectivity low-loss duplexing system comprises a first duplexer having a first port, a second port, a transmit port and a receive port. A second duplexer has a third port, a fourth port, an inverted transmit port and the receive port, the first port and the third port connected to an antenna by a balun, the transmit port and the inverted transmit port connected to at least one power amplifier, and the receive port connected to a low noise amplifier. A phase shifter comprises a lattice filter configured to short the second port to the third port and the fourth port to the first port at a receive frequency, and short the second port to the first port and the fourth port to the third port at a transmit frequency.

Alternative embodiments of the high-selectivity low-loss duplexing system include one of the following features, or any combination thereof. The receive frequency and the transmit frequency are within a mobile cellular frequency band. The receive frequency and the transmit frequency are within a radar band.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Embodiments of systems and methods described herein provide for duplexing of electronic signals with very low loss of transmitter power, without imposing precise tuning requirements and without unduly limiting transmitted power, amongst other advantages. Rather than relying on a balance network for matching an antenna impedance and use of bulky SAW and BAW filters to isolate receive and transmit signals, an intelligent phase shifting network is used. Elimination of the SAW and BAW filters advantageously enables a monolithic implementation (e.g. through silicon integration) of the duplexer with other transceiver functions, including a Low Noise Amplifier (LNA) for reception and a Power Amplifier (PA) for transmission.

Figure 1:
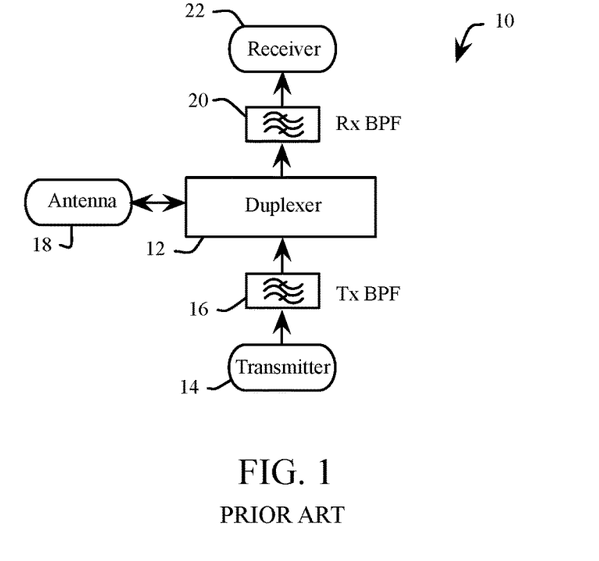
FIG. 1 is schematic view of a duplexer system with band pass filters (BPF).

FIG. 1 shows an embodiment 10 of a conventional duplexer system including a duplexer 12. A transmitter 14 transmits a signal through a transmit Band Pass Filter (BPF) 16 and to an antenna 18 through the duplexer 12. Contemporaneously, a received signal at the duplexer 12, received by the antenna 18 is filtered by a receive BPF 20 prior to being amplified by the receiver 22.

Figure 2:
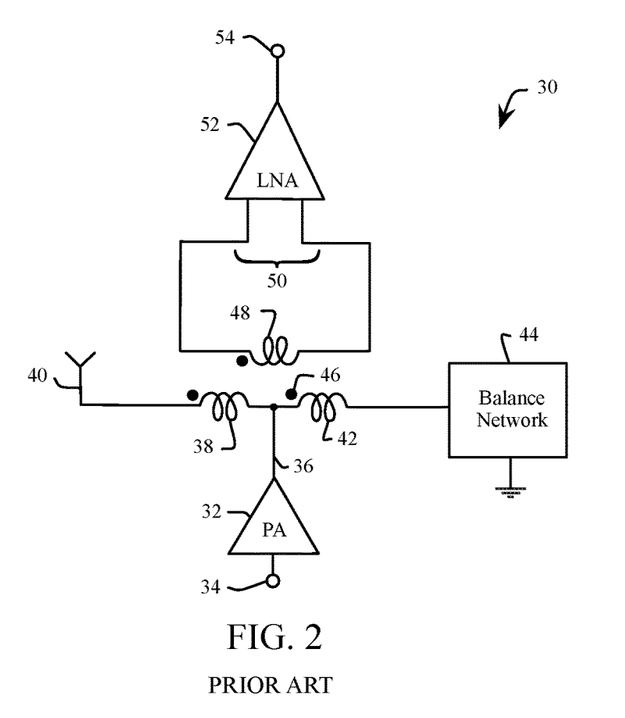
FIG. 2 is a schematic view of the duplexer system of FIG. 1 including a balance network.

FIG. 2 shows further detail of an embodiment 30 similar to the conventional duplexer of FIG. 1, including a balance network. The transmit BPF 16 and the receive BPF 20 are removed from FIG. 2 for clarity of illustration. A PA 32 amplifies a transmit signal 34, providing an output 36 to the duplexer. The output 36 induces a current in a primary winding 38 of a first transformer, and the primary winding 38 drives an antenna 40. The output 36 also induces a current in a primary winding 42 of a second transformer, and the primary winding 42 drives a balance network 44. The balance network 44 matches the impedance of the antenna 40 through precise control of components (e.g. capacitors and resistors), however the balance network also consumes approximately 50% of the transmitted power from the PA 32. The current induced between the output 36 and the antenna 40 magnetically couples into a secondary winding 48 with negative mutual induction. A current induced between the output 36 and the balance network 44, magnetically couples into the secondary winding 48 with positive mutual induction.

A "dot" symbol 46 as shown on a representative inductor 42, denotes a winding sense of a transformer (e.g. formed with inductor 38 and inductor 48 to form the first transformer, or inductor 42 with inductor 48 to form the second transformer). As used within the context of this disclosure "positive mutual induction" refers to current flowing "into the dot" of a primary winding (or the end of the primary winding shown with the dot), when a dot is also on the same end of a coupled secondary winding. "Negative mutual induction" refers to the current flowing out of the dot of a primary, when a dot is also on the same end of a coupled secondary winding.

The current flowing through the primary winding 38 substantially cancels (e.g. nullifies) the current flowing through the primary winding 42, thus resulting in zero current coupled into the secondary winding 48, and zero signal at the receive port 50. The receive port 50 is amplified by an LNA 52, with an output 54. Although substantially zero current is coupled into the receive port 50, undesirable common mode noise is coupled into port 50.

Figure 3:
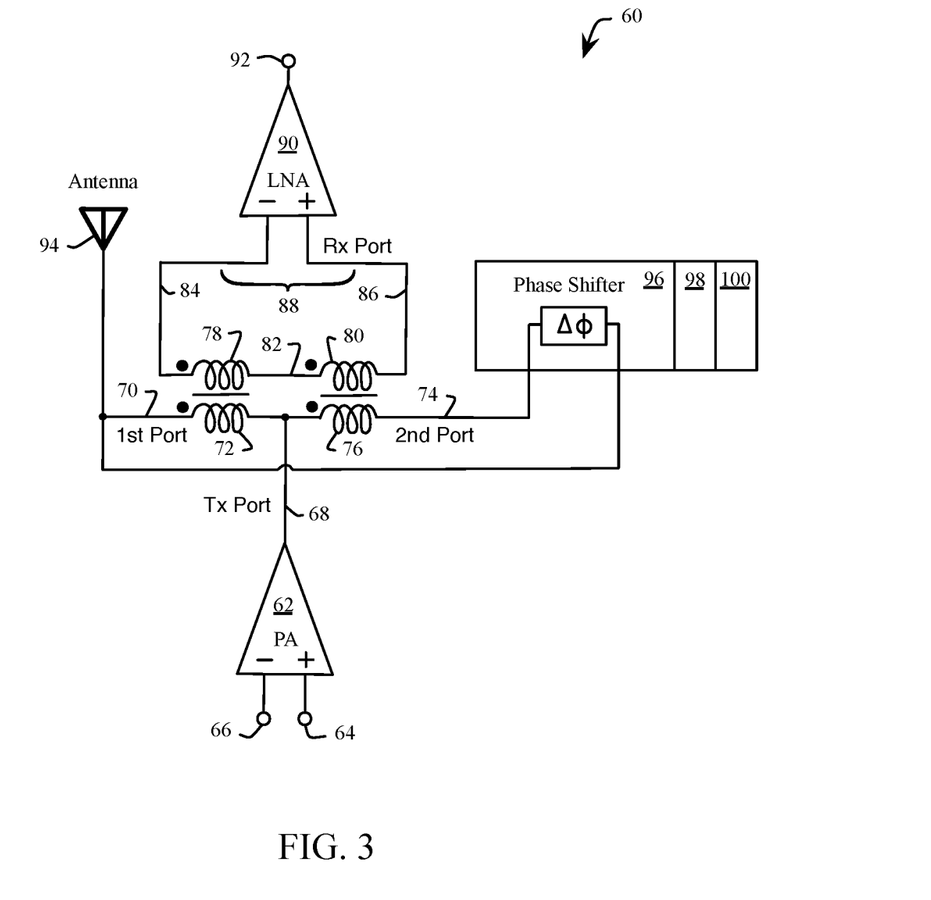
FIG. 3 is a schematic view of an embodiment of a single ended high-selectivity low-loss duplexer.

The embodiment 60 of FIG. 3 solves the limitations of the embodiments 10 and 30 by use of an intelligent phase shifting network, thereby eliminating bulky filters, and wasted transmission power amongst other advantages. The embodiment 60 includes a PA 62 for amplifying a differential transmit signal having a positive transmit signal 64 and a negative transmit signal 66. In another embodiment, the PA 62 receives a single-ended transmit signal. The PA 62 amplifies the differential transmit signal to provide a transmit output 68. The transmit output 68 couples to a first port 70 through a primary winding 72 of a first transformer. The transmit output 68 couples to a second port 74 through a primary winding 76 of a second transformer. The primary winding 72 couples to a secondary winding 78 of the first transformer. The primary winding 76 couples to a secondary winding 80 of the second transformer. In one embodiment, the secondary winding 78 is connected to the secondary winding 80 at a node 82. In various embodiments, the first transformer formed by windings 72 and 78 shares a magnetic core, and the second transformer formed by windings 76 and 80 shares another magnetic core. In other embodiments, the first transformer and the second transformer share the same magnetic core. In various embodiments, the primary windings 72 and 76 and the secondary windings 78 and 80 are chosen to have the same number of winding turns so that the current induced in the secondary winding 78 is substantially cancelled by the current induced in the secondary winding 80 in response to the transmit output 68. In another embodiment, the winding turns ratio of the primary winding 72 and the secondary winding 78 is not unity, but has the same ratio as the primary winding 76 to the secondary winding 80.

The secondary winding 78 is connected between the connection 82 and a node 84. The secondary winding 80 is connected between the node 82 and a node 86. A receive port 88 is formed between the nodes 84 and 86, which form negative and positive inputs respectively to an LNA 90. The LNA 90 has an output 92. It should be appreciated that in various embodiments, the LNA 90 is replaced with an amplifier having a single ended or a differential output. The first port 70 is further connected to an antenna 94 and a phase shifter 96. The phase shifter 96 also connects to the second port 74.

In various embodiments, the antenna 94 receives a radio frequency (RF) signal to be amplified by the LNA 90, while the PA 62 sends a signal to be transmitted by the antenna 94. The RF reception and RF transmission at the antenna 94 is either concurrent, has temporal overlap or occurs at during different time periods. During RF transmission, the PA 62 transmits a first transmit current through the primary winding 72 from the transmit output 68 to the first port 70, and a second transmit current through the primary winding 76 from the transmit output 68 to the second port 74. The second transmit current is passed through the phase shifter 96 with substantially zero phase shift at the transmit frequency and constructively added to the first transmit current at the first port 70, to be radiated by the antenna 94.

During RF reception at the antenna 94, a first received current flows through the primary winding 72 of the first transformer from the first port 70 to the transmit port 68, inducing the same current through the secondary winding 78 by positive mutual induction. A second received current also flows from the first port through the phase shifter 96, and through the primary winding 76 of the second transformer from the second port 74 to the transmit output 68. The second received current is phase-shifted by substantially 180 degrees at the receive frequency by the phase shifter 96, to negate an inversion that occurs when current that flows through the primary winding 76 is coupled into the secondary winding 80 by negative mutual induction. Specifically, current flowing from the second port 74 to the transmit output 68 will induce current to flow from the node 86 to the node 82 through the secondary winding 80, thus cancelling the current flowing from node 84 to the node 82 through the secondary winding 78.

In various embodiments, the phase shifter 96 is a frequency dependent lossless phase shifting network, providing zero phase shift at the transmit frequency and a 180 degree phase shift at the receive frequency. The term "lossless" as used within the context of this disclosure refers to a network formed primarily of active components (e.g. inductors and capacitors). It should be understood that various embodiments include parasitic elements (e.g. resistors), without substantially affecting the benefits or teachings of this disclosure. The embodiments described herein, eliminates the power loss from a balance network used for antenna impedance matching, eliminates the precise tuning requirements of the balance network, eliminates bulky SAW and BAW filters, enables higher power (e.g. radar) operation by eliminating the precise balance network and acoustic wave filters, and enables further cost reduction through monolithic implementation, amongst other advantages.

In various embodiments, the phase shifter 96 also includes a reconfiguration module 98 to change the received frequency at which the 180 degree phase shift occurs. For example, the reconfiguration module enables a multi-band cellular radio to use a single duplexer. In other embodiments, the phase shifter 96 includes a calibration module 100 to adjust the phase characteristics at the received frequency to compensate for manufacturing and environmental errors (e.g. voltage and temperature variations). In other embodiments, the phase shifter 96 includes both the reconfiguration module 98 and the calibration module 100.

Figure 4:
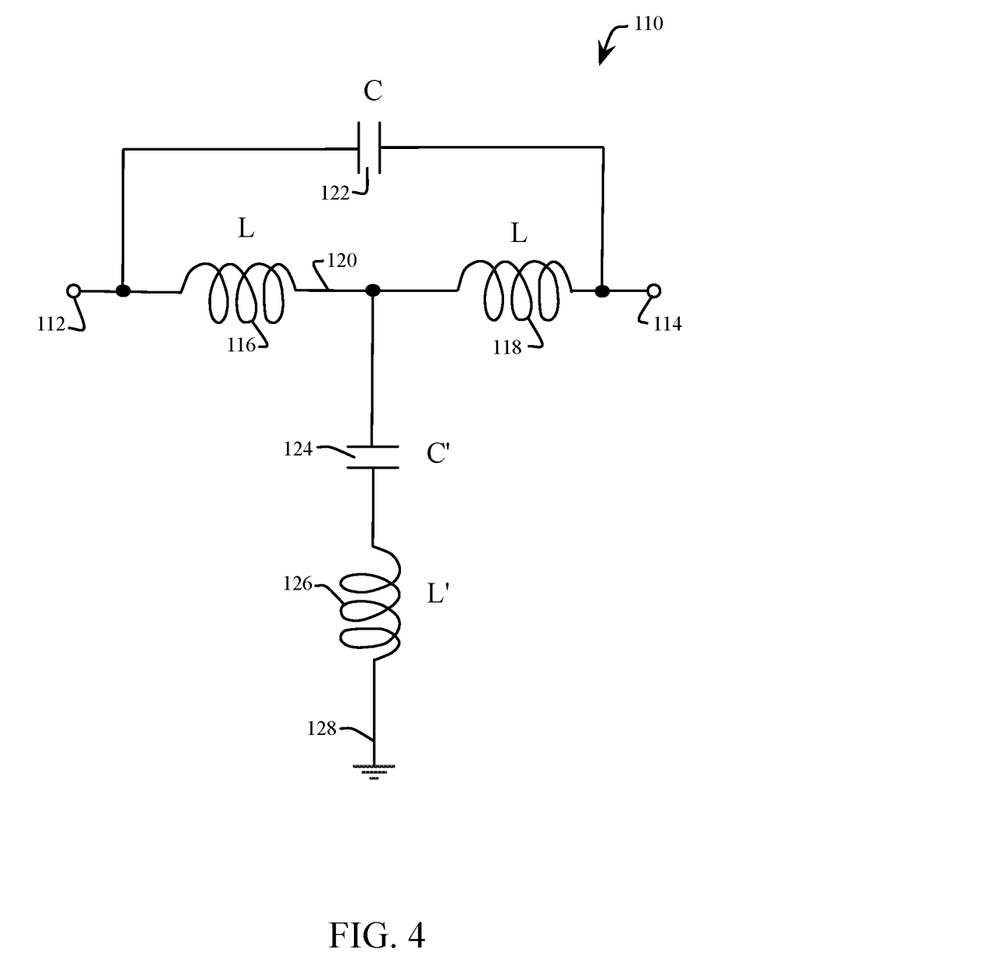
FIG. 4 is a schematic view of an embodiment of a frequency dependent lossless phase shifting network having a bridged-T delay equalizer.

FIG. 4 shows an embodiment 110 of a frequency dependent lossless phase shifting network having a bridged-T delay equalizer. The embodiment 110 includes an input 112 and an output 114. In variations to the embodiment 60, the input 112 connects to the first port 70 and the output 114 connects to the second port 74. In other embodiments, the input 112 connects to the second port 74 and the output 114 connects to the first port 72, wherein the embodiment 110 of the phase shift network is electrically symmetrical. The input 112 is connected to the output 114 with a first inductor 116 connected in series at a center tap node 120 with a second inductor 118. The input 112 is shorted to the output 114 at low frequencies by the first inductor 116 and the second inductor 118. The input 112 is also connected to the output 114 by a capacitor 122 that shunts the first inductor 116 and the second inductor 118 at high frequencies. At a received frequency (e.g. corresponding to the received frequency of embodiment 60) a shunt branch, formed by a capacitor 124 in series with an inductor 126 connected between the center tap node 120 and ground 128, resonates and thereby causes the center tap node 120 to be shorted to ground. Transformer action between the first inductor 116 and the second inductor 118 introduces a 180 degree phase shift between the input 112 and the output 114 at the received frequency.

Figure 5:
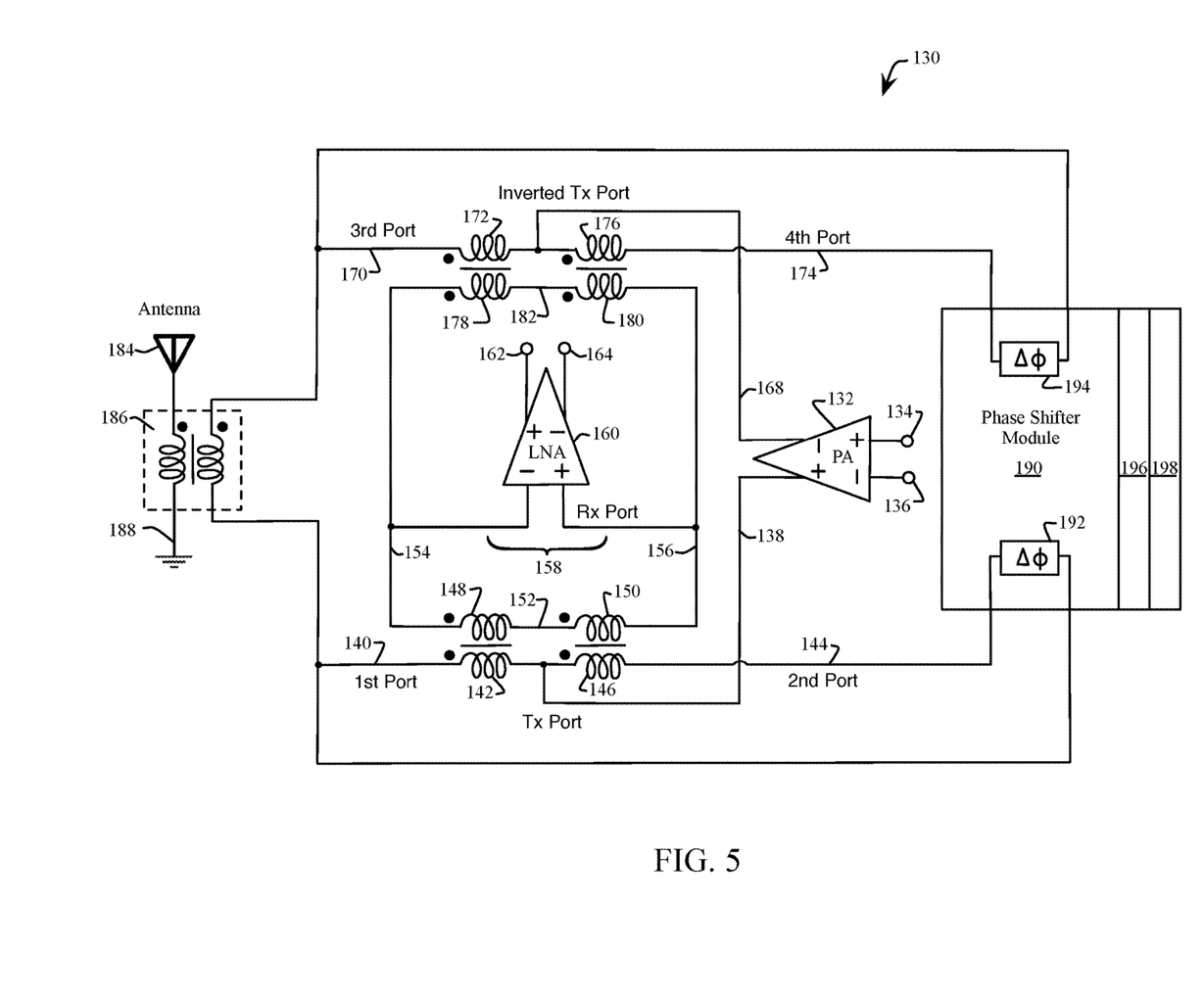
FIG. 5 is a schematic view of an embodiment of a differential high-selectivity low-loss duplexer.

The embodiment 60 of FIG. 3 is extended to a fully differential embodiment 130 shown in FIG. 5. In contrast to the embodiment 60 of FIG. 3, the differential embodiment 130 substantially eliminates common mode noise introduced into the LNA 160. A PA 132 amplifies a difference between a positive transmit signal 134 and a negative transmit signal 136 to provide a positive transmit output 138. In another embodiment, the PA 132 amplifies a single ended transmit signal. The positive transmit output 138 couples to a first port 140 through a primary winding 142 of a first transformer. The positive transmit output 138 couples to a second port 144 through a primary winding 146 of a second transformer. The primary winding 142 couples to a secondary winding 148 of the first transformer. The primary winding 146 couples to a secondary winding 150 of the second transformer. The secondary winding 150 connects to the secondary winding 148 at node 152. Similar to the embodiment 60 of FIG. 3, the first transformer formed by the primary winding 142 and the secondary winding 148 shares a common magnetic core with the second transformer formed by the primary winding 146 and the secondary winding 150 in one embodiment. In another embodiment, the first transformer and the second transformer have separate magnetic cores.

A receive port 158 is formed between nodes 154 and 156, which form negative and positive inputs respectively to an LNA 160. The LNA 160 has a positive output 162 and a negative output 164, forming a complementary output. In other embodiments, the LNA 160 has a single ended output.

The inverted transmit output 168 couples to a third port 170 through a primary winding 172 of a third transformer. The inverted transmit output 168 couples to a fourth port 174 through a primary winding 176 of a fourth transformer. The primary winding 172 couples to a secondary winding 178 of the third transformer. The primary winding 176 couples to a secondary winding 180 of the fourth transformer. The secondary winding 180 connects to the secondary winding 178 at node 182. Similar to the embodiment 60 of FIG. 3, the third transformer formed by the primary winding 172 and the secondary winding 178 shares a common magnetic core with the fourth transformer formed by the primary winding 176 and the secondary winding 180 in one embodiment. In another embodiment, the third transformer and the fourth transformer have separate magnetic cores. In various embodiments, a ratio of the number of winding turns of the primary winding 142, 146, 172 and 176 to the number of winding turns of the respective secondary windings 148, 150, 178 and 180 is not unity, while in other embodiments the ratio is unity.

The first port and the third port are connected to an antenna 184 with a balun 186. The balun 186 is further connected to a ground 188. In other embodiments, the balun 186 is connected to a voltage bias other than ground 188. In various embodiments, the antenna 184 receives an RF signal to be amplified by the LNA 160, while the PA 132 sends a signal to be transmitted by the antenna 184. The RF reception and RF transmission at the antenna 184 is either concurrent, has temporal overlap, or occurs during different time periods. The embodiment 130 further includes a phase shifter module 190, having a first phase shifter 192 and a second phase shifter 194. The first phase shifter 192 is connected between the first port 140 and the second port 144. The second phase shifter 194 is connected between the third port 170 and the fourth port 174.

During RF transmission, the PA 132 transmits a first transmit current through the primary winding 142 from the transmit output 138 to the first port 140, and a second transmit current through the primary winding 146 from the transmit output 138 to the second port 144. The second transmit current is passed through the first phase shifter 192 with substantially zero phase shift at the transmit frequency and constructively added to the first transmit current at the first port 140, to be radiated by the antenna 184.

Similarly, the PA 132 transmits a third transmit current through the primary winding 172 from the inverted transmit output 168 to the third port 170, and a fourth transmit current through the primary winding 176 from the inverted transmit output 168 to the fourth port 174. The fourth transmit current is passed through the second phase shifter 194 with substantially zero phase shift at the transmit frequency and constructively added to the third transmit current at the third port 170, to be radiated by the antenna 184. The first current from the first port 140 and the third current from the third port 170 constructively add in the balun 186 to provide a single ended current to be radiated by the antenna 184 during RF transmission.

During RF reception at the antenna 184, a first received current flows through the primary winding 142 of the first transformer from the first port 140 to the transmit port 138, inducing the same current through the secondary winding 148 by positive mutual induction. A second received current also flows from the first port 140 through the first phase shifter 192, and through the primary winding 146 of the second transformer from the second port 144 to the transmit output 138. The second received current is phase-shifted by substantially 180 degrees at the receive frequency by the first phase shifter 192, to negate an inversion that occurs when current that flows through the primary winding 146 is coupled into the secondary winding 150 by negative mutual induction. Specifically, current flowing from the second port 144 to the transmit output 138 will induce current to flow from the node 156 to the node 152 through the secondary winding 150, thus cancelling the current flowing from node 154 to the node 152 through the secondary winding 148.

Similarly, a third received current flows through the primary winding 172 of the third transformer from the third port 170 to the inverted transmit port 168, inducing the same current through the secondary winding 178 by positive mutual induction. A fourth received current also flows from the third port 170 through the second phase shifter 194, and through the primary winding 176 of the fourth transformer from the fourth port 174 to the inverted transmit output 168. The fourth received current is phase-shifted by substantially 180 degrees at the receive frequency by the second phase shifter 194, to negate an inversion that occurs when current that flows through the primary winding 176 is coupled into the secondary winding 180 by negative mutual induction. Specifically, current flowing from the fourth port 174 to the inverted transmit output 168 will induce current to flow from the node 156 to the node 182 through the secondary winding 180, thus cancelling the current flowing from node 154 to node 182 through the secondary winding 178. During RF reception at the antenna 184, the balun 186 provides a differential signal formed between the first port 140 and the third port 170.

In various embodiments, the phase shifting module 190 also includes a reconfiguration module 196 to change the received frequency at which the 180 degree phase shift occurs. For example, the reconfiguration module enables a multi-band cellular radio to use a single duplexer. In other embodiments, the phase shifting module 190 includes a calibration module 198 to adjust the phase characteristics at the received frequency to compensate for manufacturing and environmental errors (e.g. voltage and temperature variations). In other embodiments, the phase shifting module 190 includes both the reconfiguration module 196 and the calibration module 198.

In some embodiments, each of the first phase shifter 192 and the second phase shifter 194 in the phase shifter module 190 includes the bridged-T delay equalizer of FIG. 4. Specifically, the input 112 and the output 114 of the equalizer are connected to the first port 140 and the second port 144 for the first phase shifter 192, and to the third port 170 and the fourth port 174 for the second phase shifter 194. In other embodiments, the connection order of the input 112 and the output 114 are transposed because the bridged-T equalizer is electrically symmetric about the center tap node 120.

Figure 6:
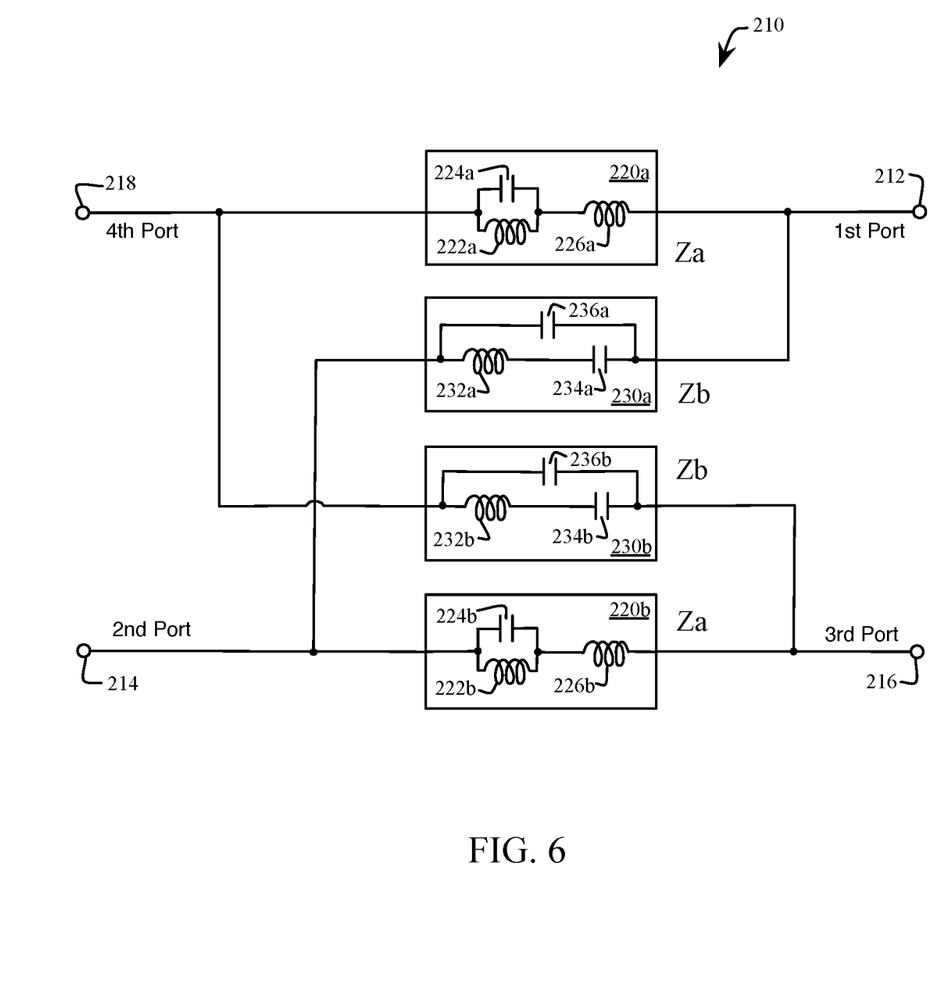
FIG. 6 is a schematic view of frequency dependent lossless phase shifting network having a lattice phase equalizer.

In other embodiments, the phase shifter module 190 includes a lattice phase equalizer with an intrinsically balanced topology. Turning now to FIG. 6 and with reference to FIG. 5, an embodiment 210 of a lattice phase equalizer includes a first port 212, a second port 214, a third port 216 and a fourth port 218. In various embodiments the first port 212, the second port 214, the third port 216 and the fourth port 218 of embodiment 210 are connected to the first port 140, the second port 144, the third port 170 and the fourth port 174 of embodiment 210, respectively.

The lattice phase equalizer includes a pass through block 220a between the fourth port 218 and the first port 212, and a pass through block 220b between the second port 214 and the third port 216, designed to be low impedance at the received frequency. Referring to FIG. 5 and FIG. 6, at the received frequency, the lattice phase equalizer shorts the fourth port 174 to the first port 140, and the second port 144 to the third port 170. Because the first port 140 is 180 degrees out of phase with the third port 170, the lattice phase equalizer effectively introduces a 180 degree phase shift between fourth port 174 and the third port 170, as well as between the second port 144 and the first port 140 for received frequencies.

The lattice phase equalizer includes a cross over block 230a between the second port 214 and the first port 212, and a cross over block 230b between the fourth port 218 and the third port 216, designed to be low impedance at the transmit frequency. Referring to FIG. 5 and FIG. 6 at the transmit frequency, the lattice phase equalizer shorts the fourth port 174 to the third port 170, and the second port 144 to the first port 140. The lattice phase equalizer effectively introduces a zero degree phase shift between the fourth port 174 and the third port 170, as well as between the second port 144 and the first port 140 for transmit frequencies.

The lattice phase equalizer has a unity gain transfer function and matched impedance (e.g. 50 Ohms) over a wide frequency range as represented by the following equation, where "Za" is the impedance of the pass through blocks 220a or 220b, "Zb" is the impedance of the cross over blocks 230a or 230b, and "$R_0$" is the characteristic impedance of the antenna 184 as seen through the balun 186:

$$Za*Zb=R_0^2$$

The transfer function "H(s)" of the lattice phase equalizer (e.g. frequency dependent lossless phase shifting network), is giving by the following:

$$H(s)=[(1-Za(s))/R_0][(1+Za(s))/R_0]$$

A example embodiment appropriate for a 3G Wideband Code Division Multiple Access (WCDMA) mobile handset application is shown in FIG. 6. The pass through block 220a (and similarly for 220b) includes an inductor 222a of 1.7 nH, in parallel with a capacitor 224a of 4 pF, both in series with an inductor 226a of 8.2 nH. The cross over block 230a (and similarly for 230b) includes an inductor 232a of 10 nH in series with a capacitor 234a of 0.67 pF, both in parallel with a capacitor 236a of 3.33 pF. Other combinations and component values are considered to be within the scope and spirit of this disclosure, with the aforementioned values presented merely for illustrative purposes. In various embodiments, the reconfiguration module 196 and the calibration module 198 alter the phase of one of the receive frequency and the transmit frequency by using varactors, or by component substitution under the control of switches for example.

Figure 7:
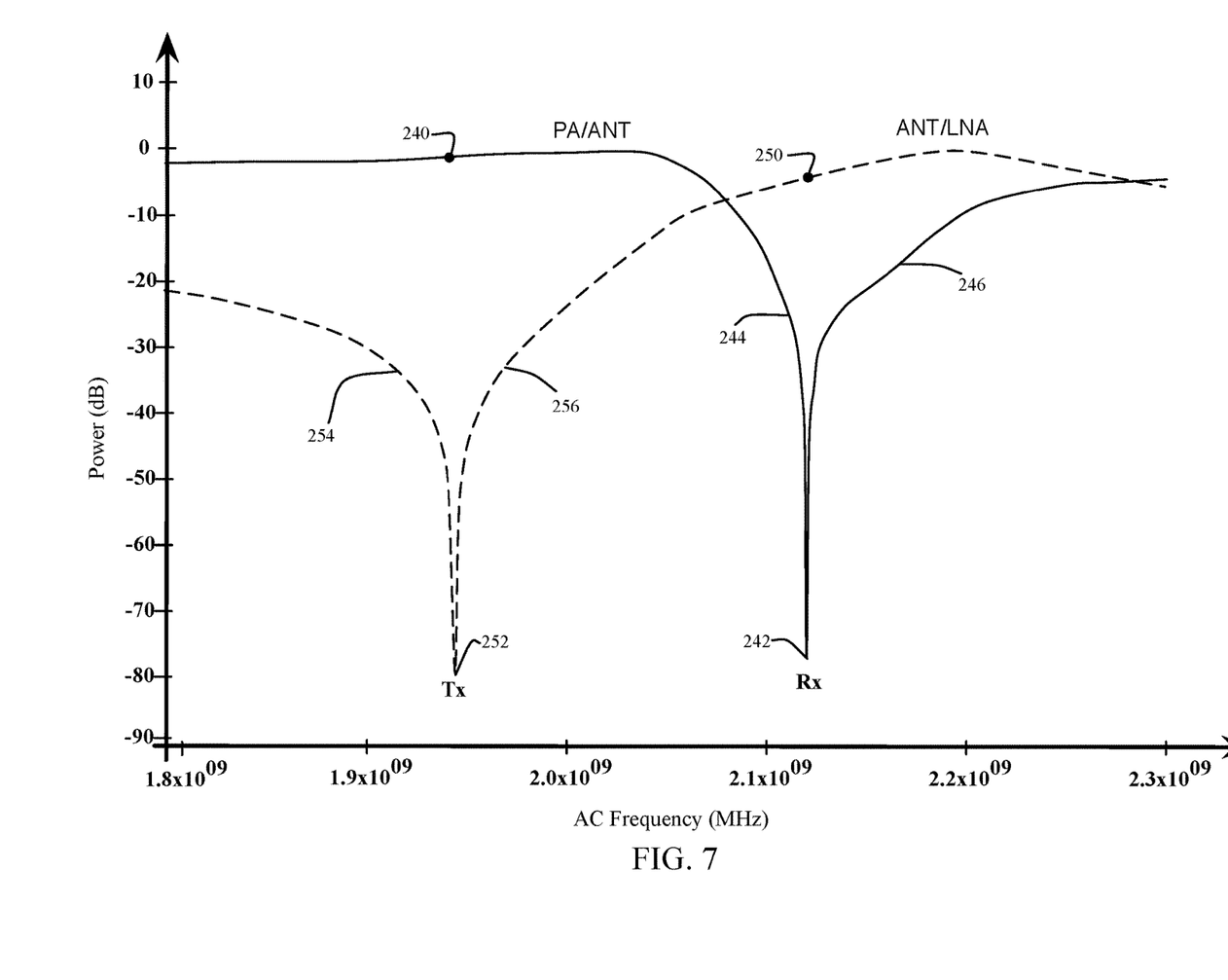
FIG. 7 is graphical view of a transfer function from a power amplifier (PA) to an antenna, and from the antenna to a low noise amplifier (LNA).
Figure 8:
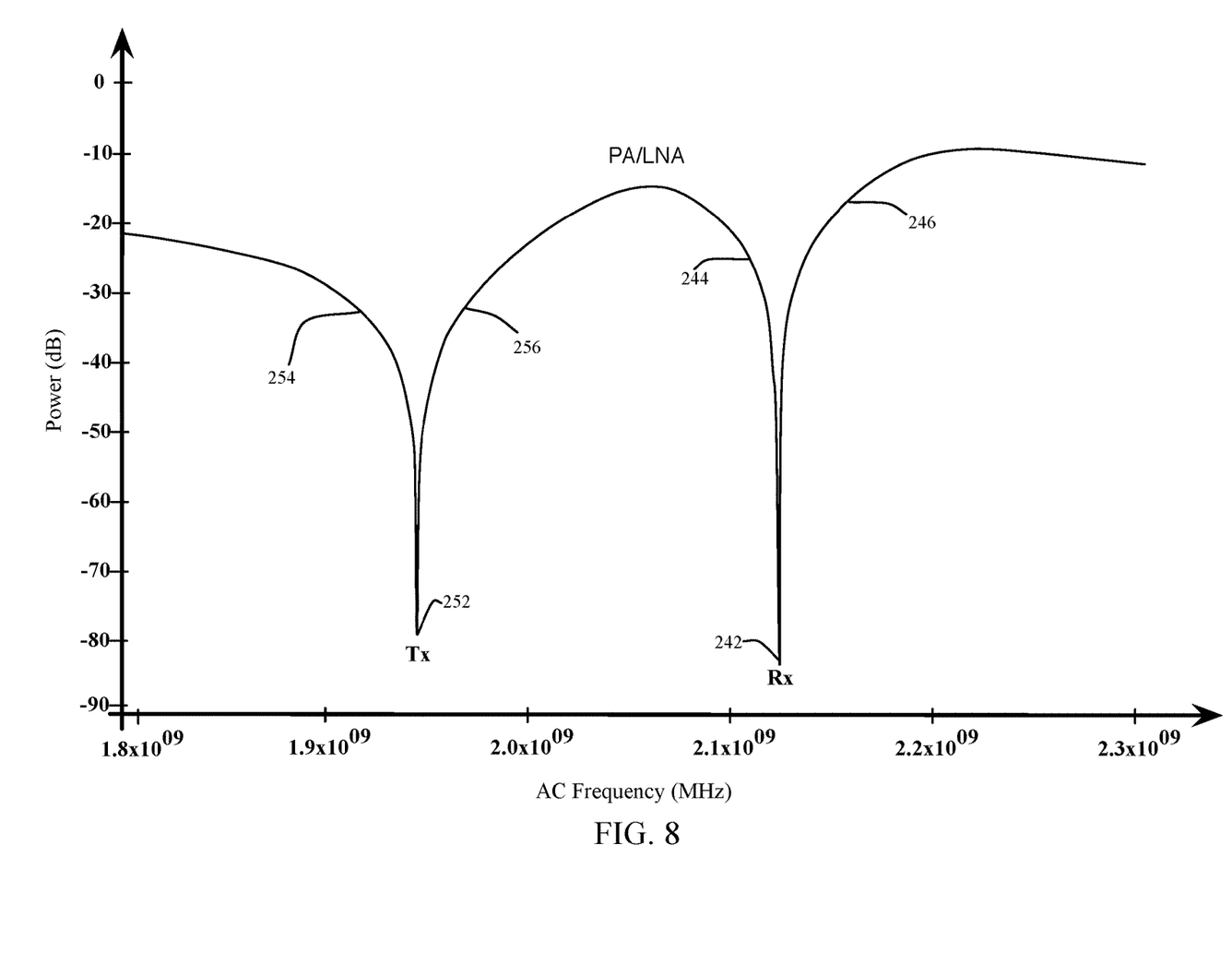
FIG. 8 is graphical view of a transfer function from the power amplifier (PA) to the low noise amplifier (LNA), of FIG. 7.

FIG. 7 and FIG. 8 show the characteristics of the embodiment 130 of FIG. 5 with the frequency dependent lossless phase shifting network of FIG. 6. The PA/ANT graph of FIG. 7 shows close to unity gain 240 at the average transmit frequency. The PA/ANT graph of FIG. 7 also shows that excellent isolation is provided between the PA 132 and the antenna 184 at the average receive frequency 242, and reasonable isolation within the receive frequency band bounded by 2110 MHz (shown at 244) and 2170 MHz (shown at 246).

The ANT/LNA graph of FIG. 7 shows close to unity gain 250 at the average receive frequency. The ANT/LNA graph of FIG. 7 also shows that excellent isolation is provided between the antenna 184 and the PA 132 at the average transmit frequency 252, and reasonable isolation within the transmit frequency band bounded by 1920 MHz (shown at 254) and 1980 MHz (shown at 256). FIG. 8 combines the two transfer functions PA/ANT and ANT/LNA shown in FIG. 7 to show the isolation between the PA 132 and the LNA 160. Other receive and transmit frequencies are realizable without departing from the spirit and scope of this disclosure. The aforementioned frequencies and frequency bands are provided merely to illustrate the systems and methods for high-selectivity low-loss duplexing.

Figure 9:
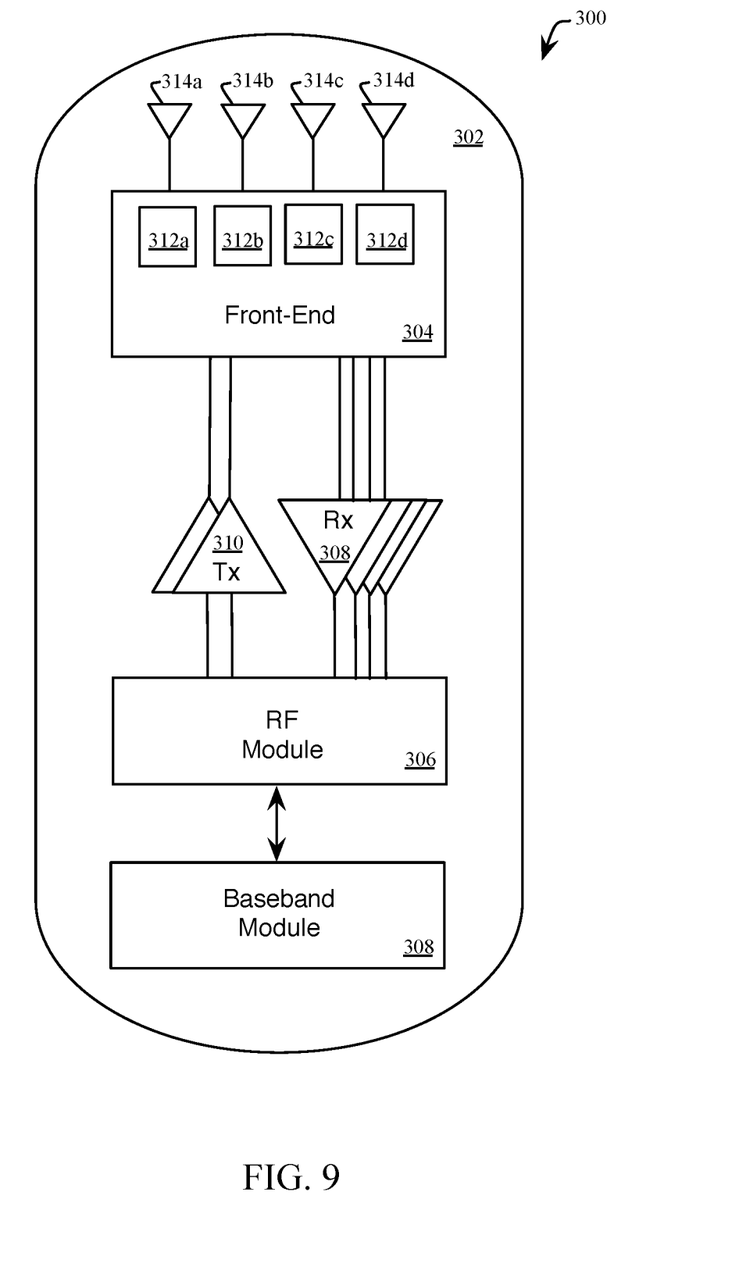
FIG. 9 is a schematic view of a mobile handset including an embodiment of the high-selectivity low-loss duplexer.

FIG. 9 shows an example embodiment 300 of a communication system including embodiments of the high-selectivity low-loss duplexer. The system 300 includes an mobile handset 302 with a plurality of antennae 314a, 314b, 314c and 314d (generally 314), each corresponding to a different receive or transmit frequency. The handset 302 includes a front-end 304, an RF module 306 and a baseband module 308. The front-end module 304 receives four channels, one from each of the antenna 314 and amplifies the received channel with a plurality of receivers (e.g. LNAs) 308, and down converts each channel with the RF module 306 for baseband processing in the baseband module 308. The baseband module 308 up converts a plurality of channels to the RF module 306, each channel being amplified by a plurality of transmitters (e.g. PA) 310 and transmitted to the antennae 314 through the front-end 304. The front-end 304 includes a plurality of high-selectivity low-loss duplexers 312a, 312b, 312c and 312d (generally 312) for efficient duplexing of the receive and transmit channels with the antennae 314.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for electronic duplexing comprising:
   coupling by positive mutual induction, an input signal at a first port to a receive port;
   coupling by negative mutual induction, a phase-shifted signal at a second port to the receive port;
   coupling by induction, an output signal at a transmit port to the first port;
   coupling by induction, the output signal at the transmit port to the second port; and
   forming the phase-shifted signal by phase shifting the input signal by 180 degrees at a receive frequency and by zero degrees at a transmit frequency.

2. The method of claim 1 further comprising:
   coupling by positive mutual induction, an inverted input signal at a third port to the receive port,
   coupling by negative mutual induction, an inverted phase-shifted signal at a fourth port to the receive port,
   coupling by induction, an inverted output signal at an inverted transmit port to the third port,
   coupling by induction, the inverted output signal at the inverted transmit port to the fourth port,
   wherein phase shifting the input signal by 180 degrees at the receive frequency comprises shorting the phase-shifted signal to the inverted input signal and the inverted phase-shifted signal to the input signal, and wherein phase shifting the input signal by zero degrees at the transmit frequency comprises shorting the phase-shifted signal to the input signal and the inverted phase-shifted signal to inverted input signal.

3. The method of claim 1 wherein a transmit-receive coupling from the transmit port to the receive port is nullified by the coupling of the output signal from the transmit port to the first port and the coupling of the output signal from the transmit port to the second port.

4. The method of claim 1 further comprising amplifying, by a differential low noise amplifier, a difference between the input signal and the phase-shifted signal, coupled to the receive port.

5. The method of claim 1 further comprising generating, by a power amplifier, the output signal at the transmit port.

6. The method of claim 2 further comprising receiving, by a balun coupled to an antenna, the input signal and the inverted input signal.

7. The method of claim 2 wherein the input signal and the output signal are contemporaneous.

8. The method of claim 2 further comprising reconfiguring one of the receive frequency and the transmit frequency.

9. The method of claim 2 further comprising calibrating a phase shift of one of the input signal and the inverted input signal to reduce one of a manufacturing process variation and an environmental variation.

10. An electronic duplexer comprising:
a first port coupled to a transmit port by a primary winding of a first transformer;
a second port coupled to the transmit port by a primary winding of a second transformer;
a receive port bridging a secondary winding of the first transformer connected to a secondary winding of the second transformer;
a phase shifter configured to phase shift an input signal at the first port to generate a phase-shifted signal at the second port, the phase shifter shifting the input signal by 180 degrees at a receive frequency and by zero degrees at a transmit frequency;
a third port coupled to an inverted transmit port by a primary winding of a third transformer;
a fourth port coupled to the inverted transmit port by a primary winding of a fourth transformer;
the receive port bridging a secondary winding of the third transformer connected to a secondary winding of the fourth transformer; and
the phase shifter further configured to phase shift an inverted input signal at the third port to generate an inverted phase-shifted signal at the fourth port, the phase shifter shifting the inverted input signal by 180 degrees at a receive frequency and by zero degrees at a transmit frequency.

11. The device of claim 10 wherein the phase shifter comprises a bridged-T delay equalizer between the first port and the second port.

12. The device of claim 10 wherein the phase shifter comprises a lattice filter configured to:
phase shift the input signal by 180 degrees at the receive frequency by shorting the phase-shifted signal to the inverted input signal and the inverted phase-shifted signal to the input signal, and
phase shift the input signal by zero degrees at the transmit frequency by shorting the phase-shifted signal to the input signal and the inverted phase-shifted signal to the inverted input signal.

13. The device of claim 10 wherein the phase shifter comprises a first bridged-T delay equalizer between the first port and the second port, and a second bridged-T delay equalizer between the third port and the fourth port.

14. The device of claim 10, wherein the first port and the third port are connected to an antenna by a balun.

15. The device of claim 10 further comprising a mode configuration module configured to modify the phase shifter for at least one of a different receive frequency and a different transmit frequency.

16. The device of claim 10 further comprising a calibration module configured to calibrate the phase shifter to reduce one of a manufacturing process variation and an environmental variation for at least one of the receive frequency and the transmit frequency.

17. A high-selectivity low-loss duplexing system comprising:
a first duplexer having a first port, a second port, a transmit port and a receive port;
a second duplexer having a third port, a fourth port, an inverted transmit port and the receive port, the first port and the third port connected to an antenna by a balun, the transmit port and the inverted transmit port connected to at least one power amplifier, and the receive port connected to a low noise amplifier; and
a phase shifter comprising a lattice filter configured to short the second port to the third port and the fourth port to the first port at a receive frequency, and short the second port to the first port and the fourth port to the third port at a transmit frequency.

18. The system of claim 17 further wherein the receive frequency and the transmit frequency are within a mobile cellular frequency band.

19. The system of claim 17 wherein the receive frequency and the transmit frequency are within a radar band.

* * * * *